(12) United States Patent
Glimm

(10) Patent No.: US 6,438,860 B1
(45) Date of Patent: Aug. 27, 2002

(54) DEVICE AND PROCESS FOR DETERMINING POSITION BETWEEN TWO PARTS WHICH ARE MOVABLE RELATIVE TO ONE ANOTHER

(75) Inventor: Andreas Glimm, Weimar (DE)

(73) Assignee: ZSP Geodaetische Systeme GmbH, Jena (DE)

( * ) Notice: Subject to any disclaimer, the term of this patent is extended or adjusted under 35 U.S.C. 154(b) by 0 days.

(21) Appl. No.: 09/641,750

(22) Filed: Aug. 18, 2000

(30) Foreign Application Priority Data

Aug. 18, 1999 (DE) .......................... 199 39 643

(51) Int. Cl.$^7$ .......................... G01B 11/26; G01B 11/02
(52) U.S. Cl. .......................... 33/707; 33/1 PT
(58) Field of Search .................. 33/1 PT, 645, 33/706, 707

(56) References Cited

U.S. PATENT DOCUMENTS

| | | | | | |
|---|---|---|---|---|---|
| 3,295,214 | A | * | 1/1967 | Neergaard | 33/707 |
| 4,529,964 | A | * | 7/1985 | Minami et al. | 33/707 |
| 4,654,527 | A | * | 3/1987 | Schmitt | 33/707 |
| 5,129,725 | A | * | 7/1992 | Ishizuka et al. | 33/707 |
| 5,301,434 | A | * | 4/1994 | Imaizumi | 33/1 PT |
| 5,553,390 | A | * | 9/1996 | Ernst | 33/706 |
| 5,678,319 | A | * | 10/1997 | Huber | 33/707 |
| 5,778,542 | A | * | 7/1998 | Spoto | 33/707 |
| 6,158,132 | A | * | 1/2000 | Kofink | 33/1 PT |
| 6,093,928 | A | * | 7/2000 | Ohtomo et al. | 33/707 |
| 6,170,162 | B1 | * | 1/2001 | Jacobsen | 33/1 PT |
| 6,293,021 | B1 | * | 9/2001 | Freitag et al. | 33/1 PT |
| 6,311,401 | B1 | * | 11/2001 | Neckel et al. | 33/1 PT |

FOREIGN PATENT DOCUMENTS

| | | |
|---|---|---|
| DE | 197 58 104 A1 | 7/1999 |
| WO | WO 91/10288 | 11/1991 |

OTHER PUBLICATIONS

*English Abstract of DE 197 58 104 A1, abstract dated Jul. 1, 1999.
Copy of German Examination Report, dated Jul. 18, 2000, with English Translation.
Copy of German Response, dated Sep. 20, 2000, with English Translation.
Copy of UK search report, dated Sep. 4, 2000.

* cited by examiner

*Primary Examiner*—G. Bradley Bennett
(74) *Attorney, Agent, or Firm*—Reed Smith LLP

(57) ABSTRACT

A device for determining position between two parts which are movable relative to one another, comprises a linear sensor arrangement, a length scale or angle scale comprising a sequence of transparent and non-transparent fields, an illumination device and elements for imaging at least one section of the scale on the sensor arrangement. The entire length scale or angle scale is divided into n graduation portions of equal length, wherein every portion contains a sequence of transparent and non-transparent marks, and the sequence is successively a number which is binary-coded with k bits and correlated with the respective portion as rough value code and a fixedly recurring number which is likewise binary-coded with k bits as a reference mark (reference mark with length of k bits). Every code bit is of equal length and is formed of a transparent and a non-transparent field (half-bit) of equal length, wherein the binary information comes from a sequence of two half-bits. A process for relative position determination shows how the sensing of the graduation and the evaluation and determination of the measurement values is carried out.

11 Claims, 3 Drawing Sheets

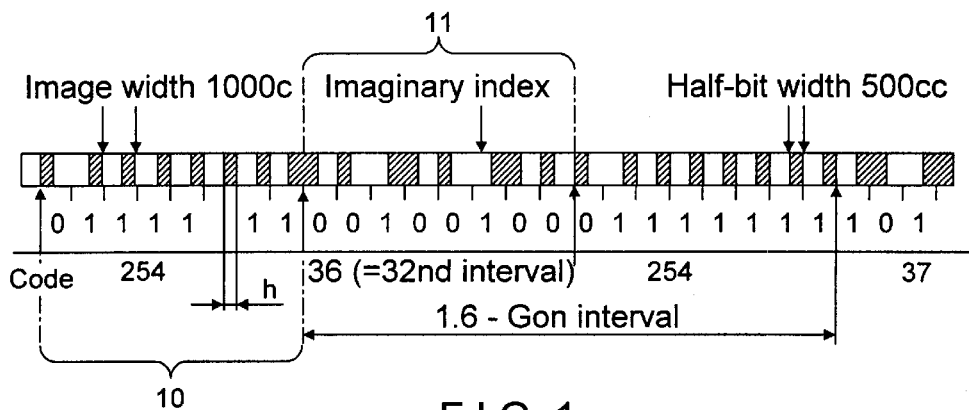
F I G. 1
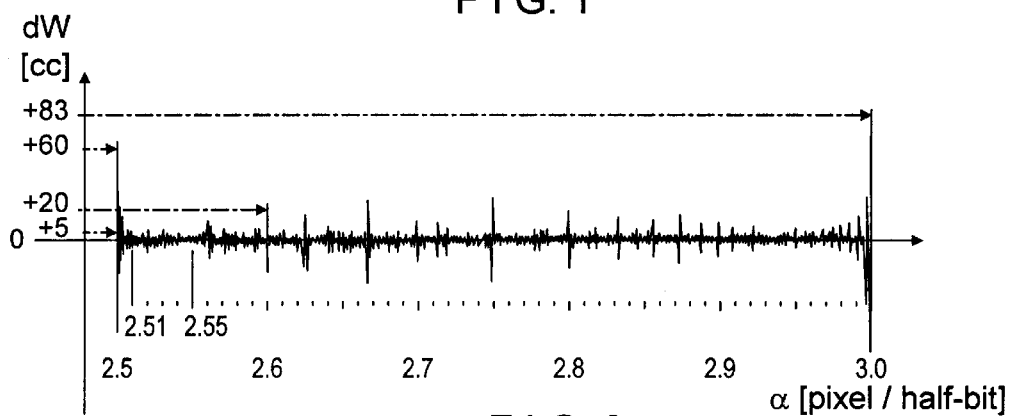
F I G. 3
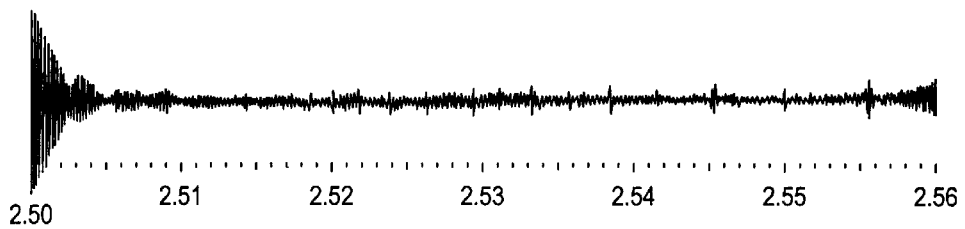
F I G. 4
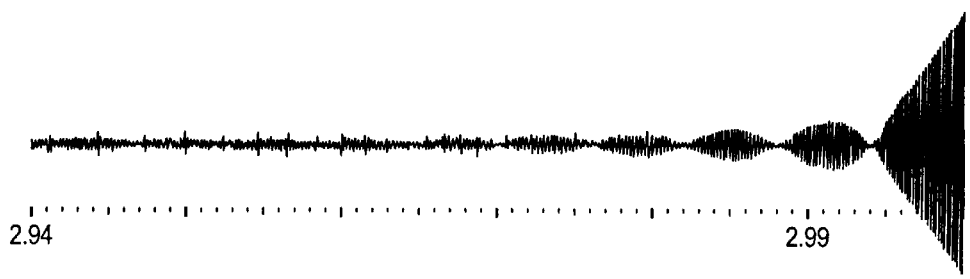
F I G. 5

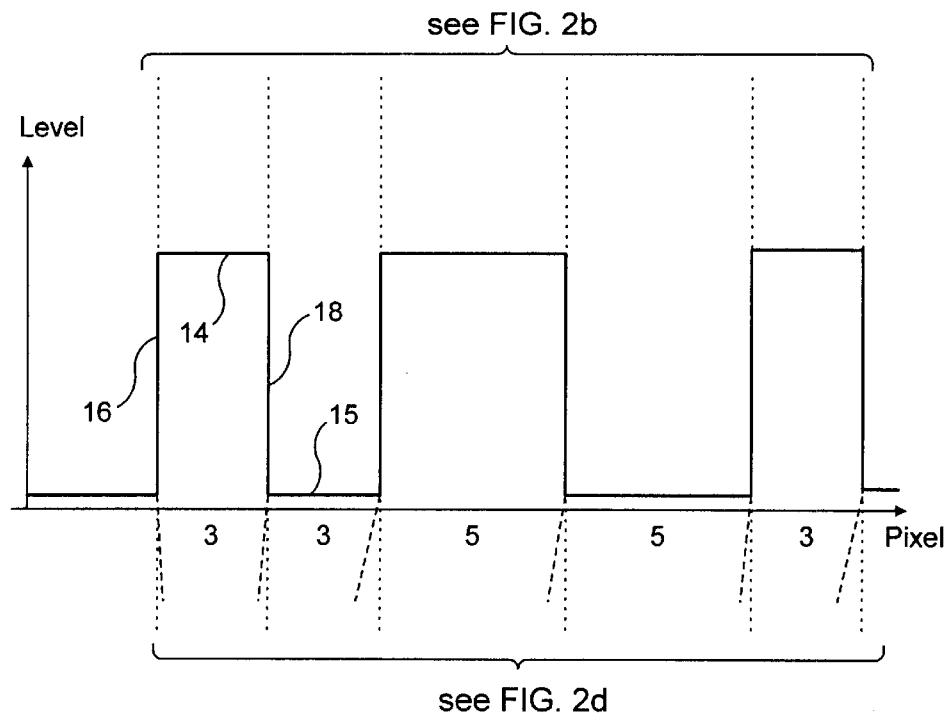
F I G. 2c
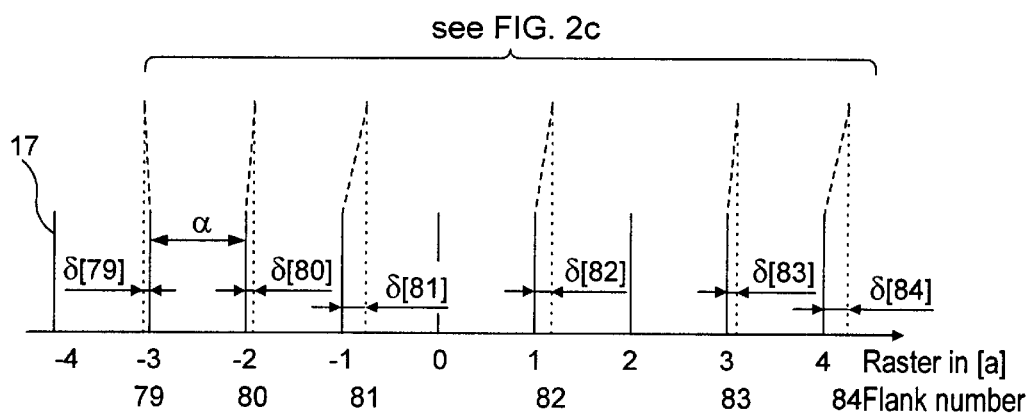
F I G. 2d

DEVICE AND PROCESS FOR DETERMINING POSITION BETWEEN TWO PARTS WHICH ARE MOVABLE RELATIVE TO ONE ANOTHER

BACKGROUND OF THE INVENTION a) Field of the Invention

The invention is directed to a device and to a process for determining position between two parts which are movable relative to one another, particularly for measuring the relative rotation or displacement of parts of instruments, machines and workpieces. The device is intended particularly for angle measurement in geodetic instruments.

b) Description of the Related Art

A large number of solutions for angle measurement are known from patents, publications and commercially available instruments. Systems in which a light-dark division on a glass carrier is provided as material measure have found widespread use, this light-dark division being imaged on or sensed by an optoelectronic sensor. The measurement signals obtained in this way are evaluated by means of a subsequent evaluating unit to obtain measurement values. There are systems with one or more parallel graduation tracks, systems which measure incremental or absolute values, and linear or surface sensor arrangements.

For user-related reasons and for cost reasons, systems with a linear sensor arrangement measuring absolute quantities have gained increasingly popularity. With a large amount of available information, the use of a standard CCD line, for example, offers an enormous advantage with respect to cost and availability compared with customized sensor arrangements. The rough value information is serially encoded in a code track and the refined or precise value information is obtained through interpolation of the rough value information.

In DE-OS 4 436 784, a scale with a code is realized in a binary manner and by means of equidistant bars. This graduation can also be read incrementally.

In DE-OS 196 38 912, a scale with a code is realized by a pseudostochastic code. The illumination device is pulsed to enable measurements with rapid movement.

WO 84/01027 describes another system with pseudostochastic code upon which a Manchester code is superimposed for increasing resolution.

In EP 0 085 951, the interpolation between equidistant bars of different widths is refined by multiple digital determination of the light centroids of every light bar with different threshold values followed by averaging.

DE 2 619 494 describes an absolute measurement system with serial binary coding of the scale and readout of the latter by linear CCD sensor lines. The resolution amounts to the width of a sensor element and is increased by optical magnification of the graduation scale.

The evaluation of the rough coding of a pseudostochastic graduation requires either a high computing output with generation of the comparison code in real time or a high storage requirement with comparison with the completely stored code. All known methods make use of only a small number of light-dark transitions and dark-light transitions (flanks) to obtain the interpolation value. Therefore, in order to realize a high resolution every flank must either be quantized with an A-D converter at an increased expenditure on hardware or must be digitized by means of a plurality of different threshold values (increased measurement time). Due to the small number of flanks, graduation errors and contamination of the graduation have a great impact on measurement accuracy.

OBJECT AND SUMMARY OF THE INVENTION

Therefore, it is the primary object of the invention to provide a device and a process for position determination between two parts which are movable relative to one another in which the disadvantages of the prior art are eliminated and in which highly reliable measurements, an accuracy in the arc second range and the possibility of modularity are achieved with very low expenditure on optics and electronics and with simple assembly and adjustment.

According to the invention, this object is met in a device for determining position between two parts which are movable relative to one another, and which comprises a linear sensor arrangement, a length scale or angle scale comprising a sequence of transparent and non-transparent fields, an illumination device and elements for imaging at least one section of the scale on the sensor arrangement. The entire length scale or angle scale is divided into n graduation portions of equal length, wherein every portion contains a sequence of transparent and non-transparent marks, and the sequence is successively a number which is binary-coded with k bits and correlated with the respective portion as rough value code and a fixedly recurring number which is likewise binary-coded with k bits as a reference mark (reference mark with length of k bits). Every code bit is of equal length and is formed of a transparent and a non-transparent field (half-bit) of equal length, wherein the binary information comes from a sequence of two half-bits. A process for relative position determination shows how the sensing of the graduation and the evaluation and determination of the measurement values is carried out.

It is advantageous when the reference mark having a length of k bits in the device encodes in binary code a number which occurs at no other section of the graduation with a length of k bits other than at the reference mark itself.

Further, for obtaining measurement values it has proven advantageous that the code graduation is divided into 250 numbered portions of equal length, the numbers of the portions and the reference mark are each encoded with 8 bits, the reference mark has the value 254, and the 250 portions are coded with numbers 4 to 127, 129 to 253 and 255, wherein the numbers 0 to 3 and 128 are not coded for portions. Thus, portions 0 to 3 are cut out and the numbering first starts at 4.

A simple construction of a device according to the invention results when the imaging of the graduation portion on the sensor arrangement is realized by pure projection without the use of further optical elements by means of a divergent illumination source of small apparent diameter. For this purpose, a virtually punctiform light source, e.g., a LED, is advantageously used for the illumination of the scale.

The transparent and non-transparent fields of the length scale or angle scale are whole-number multiples of a smallest bar width h.

In implementing the process, it is advantageous when the linear magnification or imaging scale a is selected in such a way that, with a uniform relative displacement between the code graduation and sensor line by the length of a sensor element, the quantity of the changes in the correlation of light-dark transitions and dark-light transitions to the sensor elements increases approximately uniformly from 0 to the flank number in the evaluated graduation portion.

The imaging scale a is the quotient of the pixel width and the width of the image of a half-bit on the sensor line of the sensor arrangement, namely, $$a = \text{pixel width/width of the image of a half-bit on the sensor line.}$$

A simple procedure in imaging the portions of the code graduation on the sensor arrangement results when the imaging is carried out without additional optical components. The imaging can accordingly be carried out by means of a light source emitting a virtually punctiform divergent light, e.g., a suitable LED, with zenithal or central projection on the sensor arrangement arranged close behind the code graduation in the direction of light.

In order to increase measurement accuracy, it is advantageous when a plurality of measurements are carried out making use of the signal noise and the measurement results are averaged. A further advantageous possibility for increasing measurement accuracy consists in that a plurality of measurements are carried out with different trigger thresholds and the measurement results are then averaged.

Accordingly, it can also be advantageous for a further increase in measurement accuracy using an integrating optical sensor line when a plurality of measurements are carried out with different exposure times and the measurement results are averaged.

The invention will be described more fully in the following with reference to an embodiment example.

BRIEF DESCRIPTION OF THE DRAWINGS

In the drawings:

FIG. 1 shows a section from a code track of a coded scale;

FIG. 2c shows a logical level for each sensor element;

FIG. 2d shows a mathematically formed comparison raster with deviations $\delta_i$ of the flanks from the comparison raster;

FIG. 3 shows the dependency of the systematic measurement error on imaging ratio a;

FIG. 4 shows an enlarged area from the diagram of FIG. 3; and

FIG. 5 shows another enlarged area of FIG. 3.

DESCRIPTION OF THE PREFERRED EMBODIMENTS

The inventive solution is described with reference to the embodiment example of an angle measuring system. The description can also easily be transferred to a length measuring system and applied in a corresponding way. The difference consists only in the construction of the coded scale which is formed in an elongated manner in in length measuring system and is usually arranged on a disk in an angle measurement system.

Figure 2A:
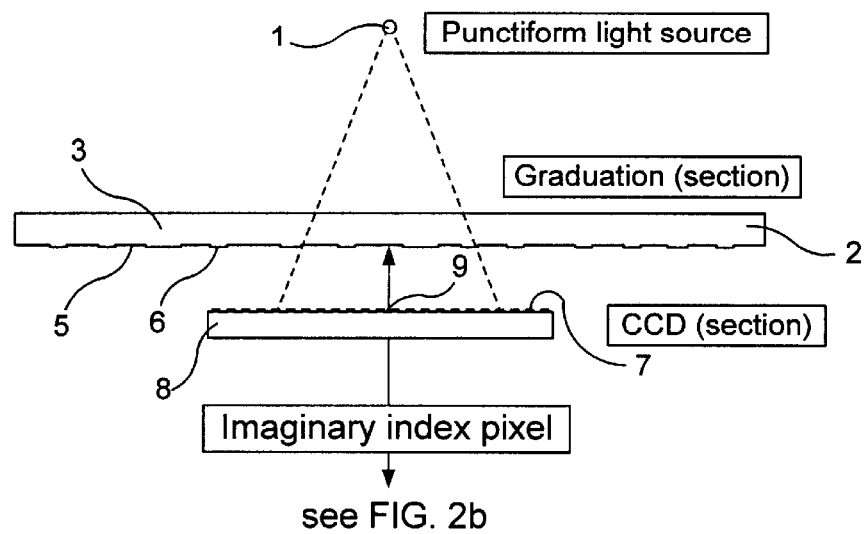
FIG. 2a shows a schematic view of the construction of a device according to the invention.

The angle measurement system according to FIG. 2a comprises an approximately punctiform light source 1 (point light LED) followed in the light direction by a scale graduation (shown as an elongated angle measurement scale for the sake of simplicity) which is arranged on a glass disk 3 and is formed of a light-dark bar sequence 5;6. The light bars of the code graduation are designated by 5 and the dark bars of the code graduation are designated by 6. A sensor arrangement 8 comprising a plurality of sensor elements 7 (pixels) is provided at a short distance immediately following the glass disk 3 and, therefore, the scale graduation 2. An arrangement and construction of this kind can be produced in a particularly simple and economical manner because, for one, costly optical components which would otherwise be used for imaging the scale graduation on the sensor arrangement 8 are not used.

In principle, a parallel projection of this scale 2 can also be provided on the sensor arrangement 8. For the sake of simplicity, this is not shown in the drawings.

LEDs with a suitable surface-area radiating surface can be used advantageously as a light source 1, wherein the light spot diameter is preferably <60 μm.

The position of a marked index pixel 9 (FIGS. 2a and 2b) of the sensor arrangement 8 (imaginary index, middle pixel of the readout area) with respect to the scale graduation 2 is exactly determined by bar width in a first step by detecting and determining the position of the projected bit pattern, wherein the smallest bar width h is set as scale and the individual bars have width x·h. The position inside the bar width (precise value; interpolation) is determined by determining the offset of the bar edge (flank) from the imaginary index. Since an A-D converter (a conventional method for determining a flank position or a centroid) is not used, the resolution or accuracy is realized by the evaluation of a very large quantity of bar edges (flanks) (see below). Consequently, when generating the code track a maximum of bar edges (flanks) was taken into account in the readout area (approximately 500 pixels correspond to an angle of 10 Gon). The code track of the graduation scale 2 shown in FIG. 1 comprises, e.g., 500 serially binary-coded portions 10 of equal length (0.8 Gon). Every portion 10 comprises an 8-bit word (byte). Every bit is of equal length (1000 cc) and, for the purpose of maximizing the flank number, comprises either a light-dark bar sequence (2 "half-bits", as they are called) for logical 1 or a dark-light bar sequence for logical 0. Every light bar and every dark bar of a bit has a width of 500 cc (half-bit; smallest structural width) and, in the embodiment example, covers approximately 2.53 pixels on the sensor arrangement 8 (imaging scale a). This gives light and dark bars with widths of 500 cc and 1000 cc. A light-dark change or dark-light change (flanks) always takes place within each bit. Changes occur between the bits when the logical level of a bit does not change. When there is a change in the signal level, no change is carried out and a bar with a width of 1000 cc results. With a graduation of this kind, approximately 160 level changes (flanks) are located in the readout area of 500 pixels. As is shown in FIG. 1, every second byte (8 bits) encodes the value "254" and serves as a synchronizing byte or start byte for detecting the start of the code. The actual location-dependent code comprises the 250 values "4 to 253" in ascending order and "255" instead of "128". This coding selection guarantees that the synchronizing byte ("254") does not occur at any other location of the graduation as bit pattern. However, the synchronizing byte ("254") occurs in every interval. An interval 12 on the graduation scale 2 comprises a portion 10 which always has the same code and the actual code 11 which is used for identifying a determined interval.

The entire circle is accordingly divided into 250 roughly encoded intervals 12, each having a length of 1.6 Gon and comprising a synchronizing byte ("254") which identifies the portion 10 and the actual code 11 (8 Gon) of the corresponding interval 12. The rough value GW is then determined by $$GW = 1.6 \text{ Gon} \cdot (\text{code} - 4),$$

with code "128" when code "255".

Referring to the example in FIG. 1, the following rough value GW results:

$$GW = 1.6000 \text{ Gon} \cdot (36-4) = 51.2000 \text{ Gon}. \quad [1]$$

In this case, the number of the respective interval 12 is "36". Since the numbers 0 to 3 are cut out, as was indicated above, the interval 12 shown is the 32nd interval of the scale graduation, that is, 36−4=32.

Since an area of approximately 10 Gon=6.25 intervals is read out, there are up to 6 rough values which are utilized for appraising and correcting a possible erroneous decoding. Successive codes must differ by 1 in each instance.

In the second step, the number of the half-bit (0 . . . 31) in which the actual code 12 of an interval is located is counted out, multiplied by the width of a half-bit (500 cc) and added to the GW:

$$GW = 51.2000 \text{ Gon} + 10 \times 0.0500 \text{ Gon} = 51.7000 \text{ Gon}. \quad [2]$$

The following description relates to obtaining the bit information described above and the precise value (interpolation value within the smallest structural width of 500 cc).

Figure 2B:
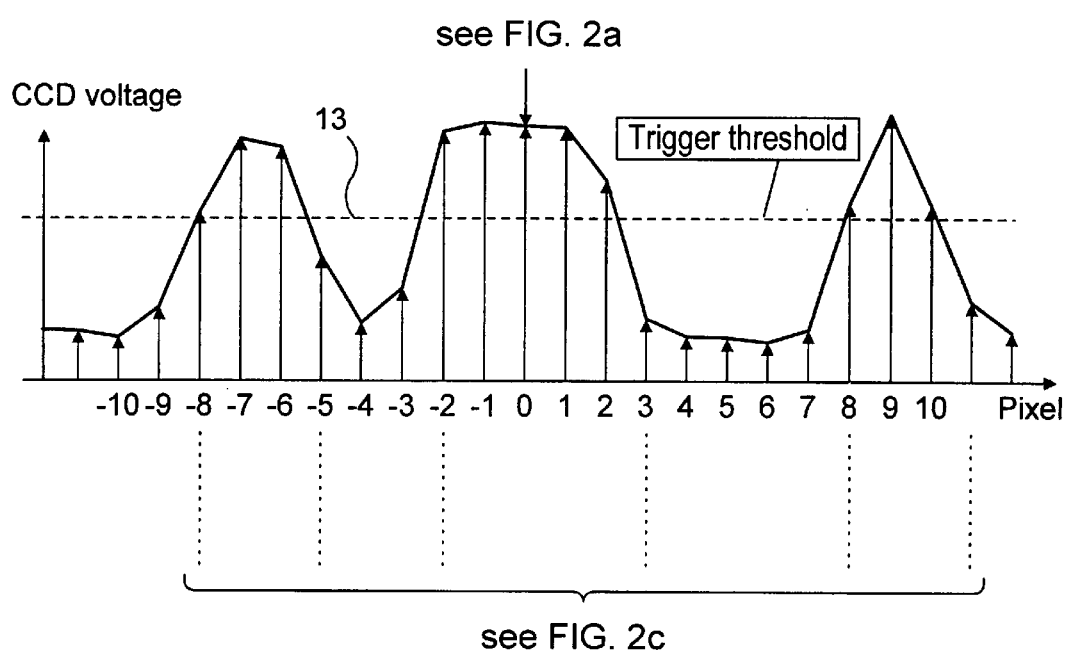
FIG. 2b shows the curve of electric output signals of the sensor elements of a sensor line.

The electric output signals of the sensor element 7 of the sensor arrangement 8 are compared serially with a fixed trigger threshold 13 approximately central to the signal swing (FIG. 2b) and is stored as a logical level (high 14 or low 15) for every sensor element 7 (pixels) (FIG. 2c). In FIG. 2b, the number of the index pixel 9 that has been fixed (measurement location, index in measuring device) is set at 0. In the embodiment example, the readout area consequently extends from pixel −250 to +249. Ideally, depending on the type of bar that is imaged, two to three successive pixels for a bar of 500 cc have the same level and four to six successive pixels for a bar of 1000 cc have the same level. In FIG. 2c, this is three pixels for a bar of 500 cc and 5 pixels for a bar of 1000 cc. Since the digitized pixel number for every bar of 500 cc and 1000 cc can diverge from the ideal ranges up to a complete loss of bar information with an asymmetric position of the trigger threshold with respect to the signal swing, for example, in the case of a soiled graduation or irregular illumination, a direct detection of a bar of 500 cc or 1000 cc from the quantity of successive pixels of the same level is not possible with any certainty. Therefore, as is shown in FIG. 2d, the exact position of every flank with respect to pixel with a mathematically formed comparison raster is compared with the fractional bar width of the comparison raster of approximately the known imaging scale a (2.53 in the embodiment example). Each flank is then correlated with the number of the comparison raster element 17 which is closest to it with resect to amount. The difference with respect to the respective number of the comparison raster element 17 of the preceding flank is then the width of the current bar in multiples of the smallest bar width (500 cc, half-bit) and the level is its binary information. FIG. 2d shows the section around the "0" index pixel with flanks "79" to "84", the associated raster elements −3a, −2a, −1a, +1a, +3a and +4a, and the differences $\delta_i$ ["79' to $\delta$[84] having mathematical signs. Accordingly, a half-bit with "low" level is detected between flanks "80" and "81" and two half-bits with level "high" are detected between flanks "81" and "82". The half-bit levels obtained in this way are shifted in a 16-bit shift register serially by half-bits and are compared with the value of the synchronizing byte ("254") after masking out every second bit. In case of agreement, the end of the synchronizing byte is reached. The respective raster element number is the negative distance of the first rough value still to be read out relative to the position of the index pixel in multiples of a half-bit (500 cc). Sixteen (16) half-bits further is the first rough value in the shift register. For the sake of certainty, all of the following rough values in the readout range are read out according to the above-indicated method and are subsequently compared with one another. This concludes the acquisition of rough values (steps 1 and 2). The calculation is carried out according to formulas [1] and [2].

During the comparison of the flanks with the comparison raster, the differences $\delta_i$[flank] are summed according to the mathematical signs and the quantity of flanks is included in the count.

The precise value calculation (interpolation within a half-bit) is then carried out as follows:

$$\text{precise value} = (500 \text{ cc}/a) \cdot \Sigma \delta_i[\text{flank}]/\text{flank quantity}, \quad [3]$$

where $\delta$[flank]=pixel[flank]−raster[flank]·a in fractions of [pixel]

and imaging scale a=pixel/half-bit in fractions of [pixel]

In a simplified example, e.g., the flank number 6 and $\Sigma\delta$[flank]=3.96 pixels and, therefore, FW=(500 cc /2.53 pixels)·3.96 pixels/6=131 cc. The complete angle value W is then:

$$W = GW + FW = 51.7131 \text{ Gon} \quad [4]$$

For an individual measurement, the theoretical resolution in the embodiment example is
a=2.53 pixels and flank number=160, when 160 flanks are used for evaluation.

$$\text{resolution} = (500 \text{ cc}/2.53 \text{ pixels}) \cdot 1 \text{ pixel}/160 = 1.24 \text{ cc}. \quad [5]$$

The accuracy of the measurement system can only attain the value of the resolution when the correlation of every flank with a pixel number with relative displacement of the graduation with respect to the line-shaped sensor arrangement is changed in an equally distributed manner by a pixel raster, i.e., with every displacement by a value of pixel raster/flank number, there must be a change of the allocation of flank to pixel number. If this is not the case, the systematic measurement error exceeds the resolution. The dependency of the systematic measurement error on the imaging ratio a is shown in FIG. 3 for the range a=2.5 . . . 3.0 pixel/half-bit, flank number=160 and a half-bit width=500 cc. For larger and smaller imaging ratios, the graphic depiction continues in a mirror-inverted manner. At approximately a=2.994 (extended view in FIG. 5), the above-mentioned condition is met, but it must be recognized that this case is limited to a sharply defined area and is surrounded by areas of higher error amplitude. Since the imaging ratio is subject to a greater tolerance because of adjusting accuracies or aging phenomena, the widest possible range of small error amplitudes must be selected. For a=2.51 . . . 2.55, it is approximately +/−4 cc with significant amplitude peaks. This range is extended and shown in an enlarged view in FIG. 4. Therefore, an average imaging ratio of a=2.53 was selected for the embodiment example.

The invention has been described by example of angle measurement. The indicated relationships can be related to length measurements and systems for length measurement.

While the foregoing description and drawings represent the preferred embodiments of the present invention, it will be obvious to one skilled in the art that various changes and modifications may be made therein without departing from the true spirit and scope of the present invention.

What is claimed is:

1. A device for determining position between two parts which are movable relative to one another, comprising:
   a linear optoelectronic sensor line arrangement, a length scale or angle scale having a code graduation and comprising a sequence of transparent and non-transparent fields;
   an illumination device;
   imaging elements for imaging at least one section of the code graduation on the linear sensor arrangement;
   said entire length scale or angle scale being divided into n graduation portions of equal length, wherein every portion contains a sequence of transparent and non-transparent marks;
   said sequence being successively a number which is binary-coded with k bits and correlated with the respective portion as rough value code and a fixedly recurring number which is likewise binary-coded with k bits as a reference mark with length of k bits; and
   every code bit being of equal length and being formed of a transparent and a non-transparent field, half bit, of equal length, wherein the binary information comes from a sequence of two half-bits.

2. The device according to claim 1, wherein the reference mark with a length of k bits encodes in binary code a number which occurs at no other section of the graduation with a length of k bits other than at the reference mark itself.

3. The device according to claim 2, wherein the code graduation is advantageously divided into 250 portions of equal length, the numbers of the portions and the reference mark are each encoded with k=8 bits, the reference mark has the value 254, and the 250 portions are coded with numbers 4 to 127, 129 to 253 and 255.

4. The device according to claim 1, wherein the imaging of the graduation portion on the sensor arrangement is realized by pure projection without the use of further optical elements by a light source of small apparent diameter.

5. The device according to claim 1, wherein the transparent and non-transparent fields are whole-number multiples of a smallest bar width h.

6. A process for determining relative position between two parts which are movable relative to one another with a device comprising a linear optoelectronic sensor line arrangement, a bar-coded graduation scale comprising a sequence of transparent and non-transparent fields, and an illumination device for illuminating and imaging at least one section of the code graduation on the linear sensor arrangement, said process comprising the steps of:
   separately determining or determining prior to each measurement for at least approximately knowing a generally fractional quantity of sensor elements which are covered (imaging scale a) by the image of a mark with the smallest bar width h on the sensor line arrangement;
   providing a trigger threshold located approximately centrally with respect to the modulation amplitude of the electric signals of the sensor elements of the linear sensor arrangement, by which the analog level of the individual sensor elements are transformed into logical high or low levels;
   determining relative position or interpolation value of a selected sensor element of the sensor arrangement within the smallest bar width h by averaging the differences between the whole-number sensor element numbers at every high-low or low-high transition or flank and the element of a numeric comparison raster which is closest in terms of amount, this numeric comparison raster being formed by whole-number multiples of the imaging scale a; and
   standardizing in that this formed average is subsequently standardized to the imaging scale a.

7. The process according to claim 6, wherein the imaging scale a is selected in such a way that, with a uniform relative displacement between the code graduation and sensor line by the length of a sensor element, the quantity of the changes in the correlation of light-dark transitions and dark-light transitions to the sensor elements increases approximately uniformly from 0 to the flank number in the evaluated graduation portion.

8. The process according to claim 6, wherein the formation of a portion of the code graduation on the sensor arrangement is realized by means of a light source by a central or parallel projection without additional optical elements.

9. The process according to claim 6, wherein a plurality of measurements are carried out and averages in order to further increase the measurement accuracy making use of the signal noise.

10. The process according to claim 6, wherein a plurality of measurements are carried out with different trigger thresholds and the measurement results are then averaged in order to further increase the measurement accuracy.

11. The process according to claim 6, wherein a plurality of measurements are carried out with different exposure times and the measurement results are averaged in order to further increase measurement accuracy using an integrating optical sensor line.

* * * * *